(12) United States Patent
Honer et al.

(10) Patent No.: US 8,508,036 B2
(45) Date of Patent: Aug. 13, 2013

(54) ULTRA-THIN NEAR-HERMETIC PACKAGE BASED ON RAINIER

(75) Inventors: Kenneth Allen Honer, Santa Clara, CA (US); Philip Damberg, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 850 days.

(21) Appl. No.: 11/803,006

(22) Filed: May 11, 2007

(65) Prior Publication Data

US 2008/0277775 A1 Nov. 13, 2008

(51) Int. Cl.
*H01L 23/10* (2006.01)
(52) U.S. Cl.
USPC ........... 257/701; 257/686; 257/700; 257/704; 257/778; 257/E21.505; 257/E21.511; 257/E23.048; 257/E23.193; 257/E25.023
(58) Field of Classification Search
USPC .......... 257/701, 686, 700, 704, 778, E21.505, 257/E21.511, E23.048, E23.193, E25.023
See application file for complete search history.

(56) References Cited

U.S. PATENT DOCUMENTS

| 5,291,062 | A | * | 3/1994 | Higgins, III | 257/698 |
| 5,381,039 | A | * | 1/1995 | Morrison | 257/701 |
| 6,274,242 | B1 | * | 8/2001 | Onodera et al. | 428/411.1 |
| 6,320,257 | B1 | | 11/2001 | Jayaraj et al. | |
| 6,952,046 | B2 | | 10/2005 | Farrell et al. | |
| 2004/0238934 | A1 | * | 12/2004 | Warner et al. | 257/686 |
| 2005/0181655 | A1 | * | 8/2005 | Haba et al. | 439/331 |

OTHER PUBLICATIONS

NASA, "Near Hermetic Packaging Technology for MMIC Devices", Foster-Miller, Inc., Waltham, MA.
Noll et al., "A Low-Cost-Hermetic Mutlichip Module Based on Luquid Crystal Polymer Dietectrics", Foster-Miller, Inc., Waltham, MA.
Wang et al., "Micromachining Techniques for Liquid Crystal Polymer", Microelctronics Laboratory, Department of Electrical and Computer Engineering University of Illinois at Urbana-Champaign.
Ely, "Issues in Hermetic Sealing of Medical Products", Medical Device & Diagnostic Industry Magazine, Jan. 2000.
Empfasis, Use of Commercial Technology in Dod RF Modules, www.empf.org/empfasis/aug04/dodrf.htm.

* cited by examiner

*Primary Examiner* — Zandra Smith
*Assistant Examiner* — Tsz Chiu
(74) *Attorney, Agent, or Firm* — Lerner, David, Littenberg, Krumholz & Mentlik, LLP

(57) ABSTRACT

A microelectronic package including a dielectric layer having top and bottom surfaces, the dielectric layer having terminals exposed at the bottom surface; a metallic wall bonded to the dielectric layer and projecting upwardly from the top surface of the dielectric layer and surrounding a region of the top surface; a metallic lid bonded to the wall and extending over the region of the top surface so that the lid, the wall and the dielectric layer cooperatively define an enclosed space; and a microelectronic element disposed within the space and electrically connected to the terminals.

15 Claims, 6 Drawing Sheets

ULTRA-THIN NEAR-HERMETIC PACKAGE BASED ON RAINIER

BACKGROUND OF THE INVENTION

The present invention relates to microelectronic packages used for microelectronic chip packaging, and methods for making microelectronic packages for microelectronic chip packaging.

Semiconductor chips are commonly provided in packages that facilitate handling of the chip during manufacture and during mounting of the chip on an external substrate such as a circuit board, wiring board or other circuit panel. For example, many semiconductor chips are provided in packages suitable for surface mounting. Such packages which can be surface mounted can provide reduced thermal resistance as well as an extremely low electrical resistance between the chip and the package and wiring for external connection. Numerous packages of this general type have been proposed for various applications. Certain types of packages have been developed which utilize a microelectronic component having a flexible dielectric substrate having conductive traces disposed thereon. In such an arrangement, electrically conductive posts, pillars or other connection elements project from a surface of the flexible substrate. Each post is connected to a portion of one of the traces, the traces being arranged on the other surface of the flexible surface, and are configured to be connected with a chip.

This type of microelectronic component has various applications and can be used in a number of different microelectronic package arrangements. As disclosed in certain preferred embodiments of U.S. patent application Ser. Nos. 11/014,439; 10/985,119; and 10/985,126, the disclosures of which are incorporated by reference herein, one such microelectronic package can include a microelectronic element such as a semiconductor chip and a microelectronic component comprising a flexible substrate spaced from and overlying a first face of the microelectronic element. Such a component can include a plurality of conductive posts extending from the flexible substrate and projecting away from the microelectronic element, at least some of the conductive posts being electrically interconnected with said microelectronic element. Additionally, such a package can include a plurality of support elements disposed between the microelectronic element and the substrate and supporting the flexible substrate over the microelectronic device.

Despite these advances in the art of semiconductor package assemblies and existing hermetic packages, still further improvements in making microelectronic components would be desirable. A packaging method and device is needed to fabricate a compact, thin, and substantially hermetic package.

SUMMARY OF THE INVENTION

According to an aspect, a microelectronic package is provided. Preferably, the microelectronic package includes a dielectric layer having top and bottom surfaces, the dielectric layer having terminals exposed at at least one of the surfaces. In addition, the microelectronic package includes a metallic wall bonded to the dielectric layer and projecting upwardly from the top surface of the dielectric layer and surrounding a region of the top surface, a metallic lid bonded to the wall and extending over the region of the top surface so that the lid, the wall and the dielectric layer cooperatively define an enclosed space. Furthermore, a microelectronic element disposed within the space and electrically connected to the terminals.

Another aspect is a method of making a microelectronic package. The method desirably comprises the step of providing a dielectric layer having top and bottom surfaces, terminals exposed at least one of the surfaces, and a wall projecting upwardly from the top surface. The method according to this aspect preferably also includes the step of mounting a microelectronic element over a region of the top surface surrounded by the dielectric layer and electrically connecting the microelectronic element to at least some of the terminals, and a further step of bonding a metallic lid to the wall so that the lid extends over the microelectronic element and the microelectronic element.

A further aspect provides a method of making a microelectronic chip carrier. A method according to this aspect desirably includes providing a composite metallic plate including a base layer of a metal and a conductive layer; etching the base layer to form a wall; and etching the conductive layer to separate the conductive layer into individual conductive elements. The method most preferably further includes the step of uniting the conductive elements and wall with a dielectric layer so that the wall projects upwardly away from the dielectric layer and encircles a region of the dielectric layer, and so that the conductive elements are carried on the region of the dielectric layer encircled by the wall. For example, the step of uniting the conductive elements and the wall with the dielectric layer may include uniting the dielectric layer with the composite metallic plate after etching the conductive layer to separate the conductive layer into individual conductive elements, and before etching the base layer to form the wall. Alternatively, the step of uniting the conductive elements and the wall with the dielectric layer may be performed by uniting the dielectric layer with the composite metallic plate before etching the base layer to form the wall, and the step of etching the conductive layer to form the individual conductive elements may be performed during or after etching the base layer to form the wall.

These and other features, and advantages, will be more clearly understood from the following detailed description taken in conjunction with the accompanying drawings. It is important to point out that the illustrations may not necessarily be drawn to scale, and that there may be other embodiments which are not specifically illustrated.

DETAILED DESCRIPTION

Figure 1A:
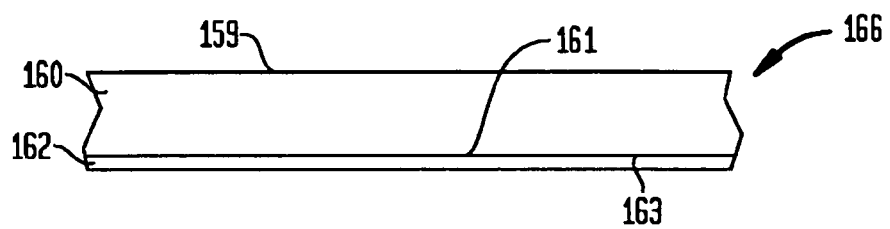
FIGS. 1a-1h are diagrammatic sectional views of a chip carrier according to a first embodiment during various stages of a manufacturing process.
Figure 1B:
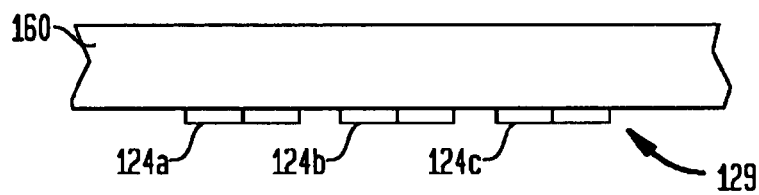
Figure 1C:
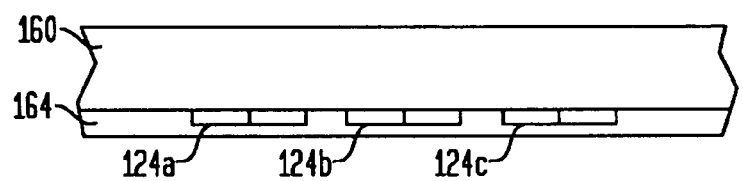
Figure 1D:
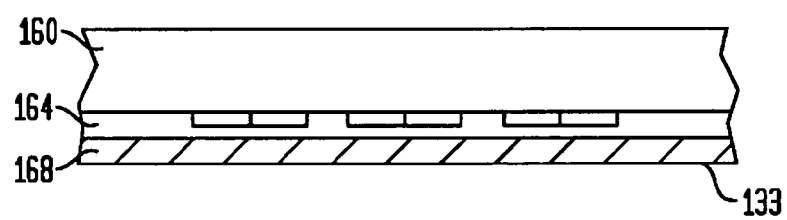
Figure 1E:
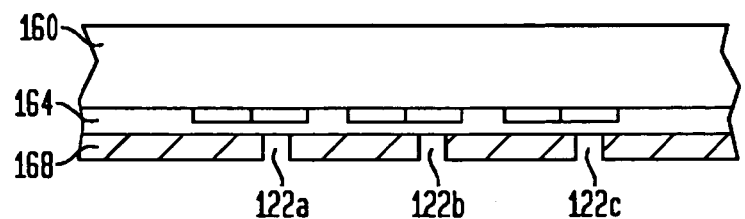
Figure 1F:
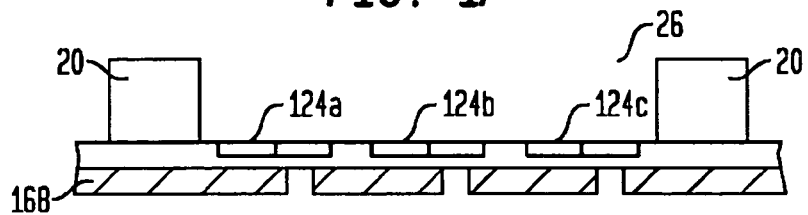
Figure 1G:
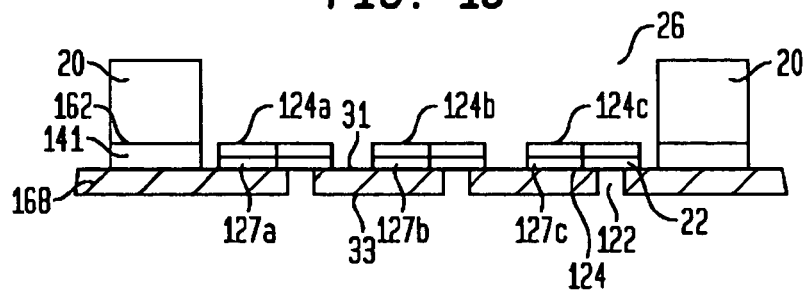
Figure 1H:
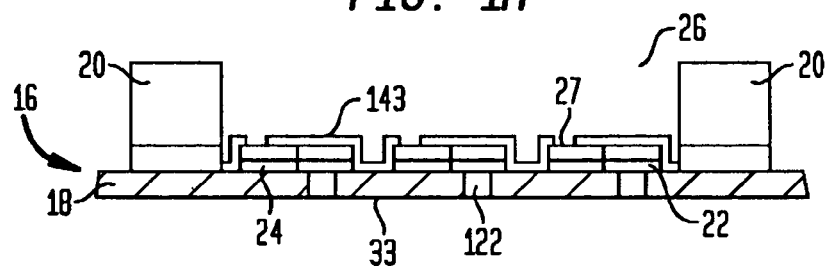
Figure 1I:
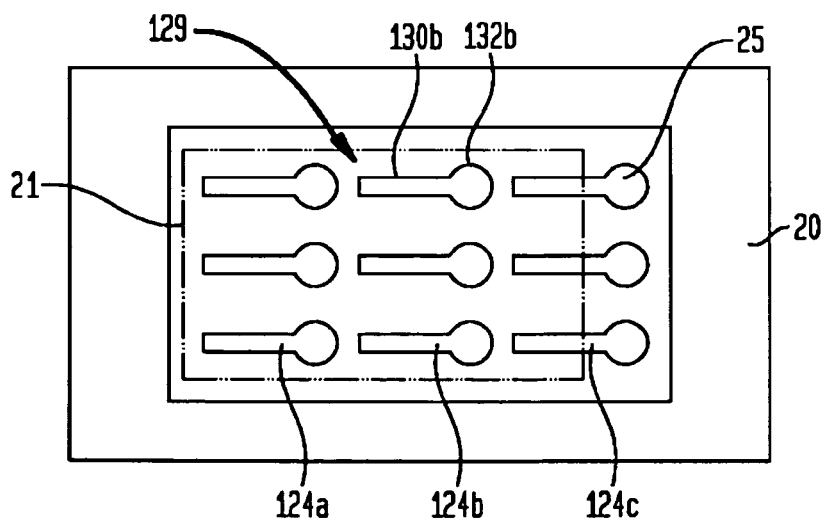
FIG. 1i is a top plan view of the chip carrier at the stage of manufacture shown in FIG. 1f.
Figure 2:
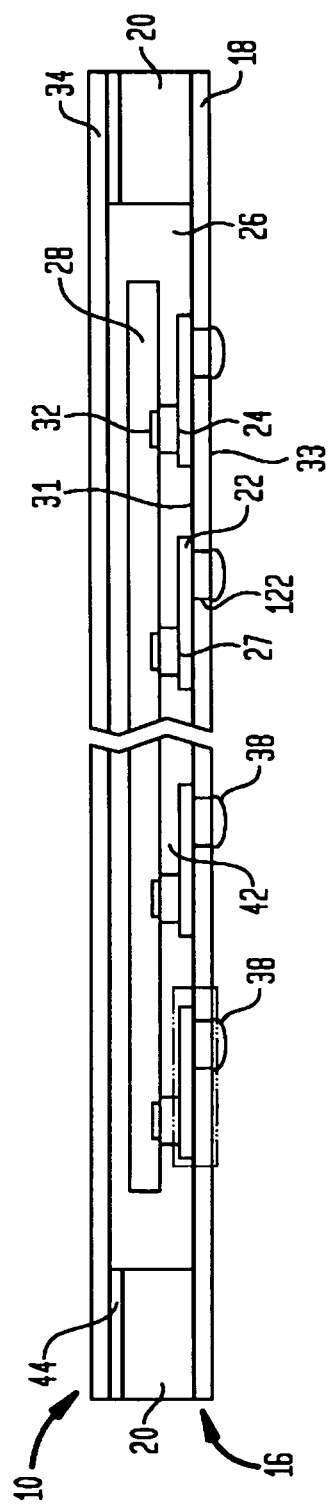
FIG. 2 is a diagrammatic sectional view depicting the completed package using the chip carrier formed according of FIGS. 1c-1i.

FIGS. 1*a*-1*i* show a manufacturing method for making the chip carrier 16 together with the metallic walls 20 shown in FIG. 2, in accordance with a first embodiment. The chip carrier 16 serves as a base for a hermetic, airtight, or near-hermetic package 10. The manufactured package 10 shown as an exemplary embodiment in a possible end state in FIG. 2.

A manufacturing process according to this embodiment starts with a subassembly or composite metallic plate 166 (FIG. 1*a*) including an etch-resistant layer 162 having an upper surface 159 and a lower surface 161. The metallic plate 166 also includes a base layer 160 having an upper surface and a lower surface. The etch-resistant layer 162 is disposed on the base layer 160, such that the upper surface 163 of the etch-resistant layer 162 confronts the lower surface 161 of the base layer 160. Only a small portion of subassembly 166 is shown in FIG. 1*a*. The subassembly typically is provided as a large sheet or tape having area sufficient to form numerous chip packages As used in this disclosure, terms such as "upwardly," "upper," "top," "downwardly," "lower," "bottom," "vertically," and "horizontally" should be understood as referring to the frame of reference of the element specified and need not conform to the normal gravitational frame of reference. In FIGS. 1*a*-1*b*, the upward direction is the direction towards the top of the drawing.

The etch-resistant layer 162 is preferably an etch-resistant layer constructed from a metal such as nickel or other metal which resists attack by an etching agent, which agent will readily attack the metal of base layer 160. The etch-resistant layer 162 is relatively thin and in certain preferred embodiments is a fraction of a micron to a few microns thick as, for example, 1 micron thick. The base layer 160 is constructed from conductive material such as copper. In comparison to the etch-resistant layer 162, the base layer 160 is relatively thick and in certain preferred embodiments the base layer has a thickness approximately between 50 μm to 1500 μm. Since the base layer 160 will form metallic walls that will encircle a recess holding a microelectronic device, the base layer 160 can be high enough to surpass an upper edge of a microelectronic device 28 that has to be packaged. Merely by way of example, the subassembly or plate 166 may be formed by plating the etch-resistant layer onto the top surface of the base layer 160.

Once the subassembly or composite plate 166 has been formed, the etch-resistant layer 162 may be selectively patterned, as shown in FIG. 1*b*, and also shown from a top perspective in FIG. 1*i*. In one such technique, the etch-resistant layer 162 is subjected to a wet-etching process to remove unwanted portions of the etch resistant layer 162. The etchant used in this step may be selected so that it does not substantially attack the base layer 160. For example, where the base layer 160 is formed from copper and the etch-resistant layer 162 is formed from nickel, an etchant including HCl may be used to remove the nickel. Alternatively or additionally, the process may be monitored and terminated promptly after the unwanted portions of the etch-resistant layer are removed.

In an alternate embodiment, the etch-resistant layer 162 may be selectively plated onto desired portions of the base layer 160 as for example using a mask and plate technique.

The etching of the etch-resistant layer 162 exposes portions of the lower surface of the base layer 160. As shown in FIG. 1*b*, the portions of the etch-resistant layer 162 not etched away may form a skeleton pattern 129. For example, the etch-resistant layer 162 may be a nickel layer, the etchant may be based on Sulfuric Acid and Hydrogen Peroxide. The skeleton pattern, seen at a later stage of manufacture in FIG. 1*i*, includes numerous islands 124*a*, 124*b*, and 124*c*, each having an elongate trace-forming portion 130 and a circular terminal-forming portion 132. The elongate portions 130 are contiguous with the circular portions 132.

Although only a small number of islands 124*a*, 124*b*, and 124*c* are shown for clarity of illustration, in actuality, a much higher number of islands may be employed. Also, the patterned islands 124*a*, 124*b*, and 124*c* may have different geometric configurations and/or interconnecting bridges, which connect one island to another. As will be described below, the shape and positioning of skeleton pattern 129 employed is dependent on a desired layout of conductive features such as terminals and traces in the finished package 10.

With reference to FIG. 1*c*, once the etch-resistant layer 162 has been patterned, a conductive layer 164 may be disposed over the remaining portions of the etch-resistant layer and the exposed portions of the upper surface of the base layer 160. Thus, the conductive layer 164 is positioned adjacent to the upper surface of the remaining portions of the etch-resistant layer 162, now forming a skeleton pattern 129. The conductive layer 164 is preferably comprised of a metal such as copper, and is plated or laminated onto the various surfaces. The conductive layer 164 is preferably planar. The conductive layer 164 may have very shallow depressions (not shown) corresponding to the gaps between the islands 124*a*, 124*b*, and 124*c*, in the etch-resistant layer. Any such depressions will have a depth no more than the thickness of the etch-resistant layer 162, and most typically less than the thickness of the etch-resistant layer 162. Thus, any such depressions will have a depth on the order of a few microns or less and typically 1 micron or less. Conductive layer 164 has a thickness equal to the desired thickness of contact pads 24 or other conductive elements in the finished chip carrier 16, preferably between 5 and 50 microns, most typically between 10 and 20 microns.

Referring to FIG. 1*d*, a dielectric layer 168 is positioned adjacent the conductive layer 164 with a lower surface 33 of the dielectric layer 168 facing away from conductive layer 164. The dielectric layer 168 may be comprised of many different materials. Preferably, the material is flexible. Where a hermetic or near-hermetic package is desired, the material desirably has low moisture absorption and low diffusion. For example, a high-performance polymeric dielectric can be used for the dielectric layer 168, such as liquid crystal polymer (LCP). LCP layers are virtually impermeable by liquids and gases. In addition, LCP layers have a very low moisture absorption coefficient and a constant dielectric coefficient and low loss factor over a wide frequency range. The LCP layers present other advantages that are desirable for the use as substrate material for a hermetic or near-hermetic package, such as good dielectric strength, low coefficient of thermal expansion, providing dimensional and electrical stability under thermal cycles. Suitable LCP materials that can be used include VECTRA™ (from the manufacturer, Hoechst-Celanese), XYDAR™ (Amoco), and ZENITE™ (DuPont).

The dielectric layer 168 may be adhered to the conductive layer 164 using an adhesive, which may be a separate layer or incorporated into the dielectric layer. The dielectric layer 168 may have any thickness, but most typically is about 15-100 μm thick. Since the conductive layer 164 is substantially smooth and flat, the dielectric layer will also be smooth. Moreover, the dielectric layer 168, and any adhesive layer used to connect the dielectric layer 168 with the conductive layer 164, will be of substantially uniform thickness.

Once the dielectric layer 168 is positioned correctly, holes 122*a*, 122*b*, and 122*c* may be created in the dielectric layer 168, as shown in FIG. 1*e*. The holes 122*a*, 122*b*, and 122*c* may be created by physically or chemically etching away unwanted portions of the dielectric layer 168. The holes can be formed by conventional techniques. Examples of plasma etching techniques for LCP layers can be found in the article "Micromachining Techniques for Liquid Crystal Polymer," Wang et al., the 14th IEEE International Conference on Micro Electro Mechanical Systems, 2001, MEMS 2001, Interlaken, Switzerland, pages 126-130, this reference being herewith incorporated by reference herein. Other techniques such as laser ablation can be used. Preferably, the holes 122*a*, 122*b*, and 122*c* are aligned with the circular terminal-forming portions 132*a*, 132*b*, and 132*c* of islands 124*a*, 124*b*, and 124*c*, formed from the etch resistant layer 162.

Referring to FIG. 1*f*, next the base layer 160 is etched or otherwise treated to form a recess 26 in the base layer 160, leaving a metallic wall 20. The metallic wall 20 forms a recess 26 that gives access to the islands 124*a*, 124*b*, and 124*c*. In addition, the metallic wall 20 will surround the islands 124*a*, 124*b*, and 124*c*. The metal wall 20 has a base 141 formed by etching conductive layer 164 as discussed below.

The dimensions of the metallic wall 20 can vary over a significant range, depending on the dimensions of the microelectronic device that has to be packaged. Typically the height of the wall on top of the surface of the conductive layer 164 is in a range from 50 μm to 500 μm. The thickness of the metallic wall 20 measured in a direction parallel to the layers 160, 162 most commonly is in a range of 250-500 μm. In other embodiments, the metallic walls 20 may be tapered so that their thickness varies with height, or slanted.

During or after the formation of metallic walls 20, a pattern is formed in conductive layer 164. For instance, during the etching of the base layer 160, the etching process is allowed to continue past the etch-resistant layer 162 and into the conductive layer 164 in those regions of the conductive layer 164 which are not covered by the islands 124*a*, 124*b*, 124*c* of the etch-resistant layer. The material chosen for the etching process does not substantially react with the material in the etch-resistant layer 162. Copper etch that does not attack a nickel etch resistant layer 162 can be used, for example an etching material based on Ammonium or Ammonium Chloride. Thus, as shown in FIG. 1*g*, as a result of the etching process, a second skeleton pattern is created in the conductive layer 164, which essentially is a copy of the skeleton pattern 129 of etch-resistant layer 162, thereby forming second islands 127*a*, 127*b*, 127*c* in contact with the islands 124*a*, 124*b*, 124*c* of the etch-resistant layer and in contact with the dielectric layer 18. Although not shown seen in FIG. 1*g*, the second islands 127*a*, 127*b*, 127*c* also include circular terminal-forming portions corresponding to circular portions 132 (FIG. 1*i*) in the etch-resistant layer and elongate trace-forming portions corresponding to the trace-forming portions 130. The circular portions of the second islands 127*a*, 127*b*, 127*c* form terminals 22, and the elongate portions of the second islands form traces 24 extending from the terminals.

Optionally, the remaining exposed portions of the etch-resistant layer, such as islands 124*a*, 124*b*, and 124*c*, can be removed at this stage of the process, for example, by a step of etching with an etchant that does not attack the dielectric layer 168.

With reference still to FIG. 1*h*, a solder mask layer 143 is deposited onto the upper surfaces and the side walls of the terminals 22 and traces 24 and onto those portions of the upper surface 31 of the dielectric layer 168 that are not covered by the terminals 22 and traces 24. The solder mask layer 84 may be applied by draping a preexisting layer of a photoimageable masking material in a soft, pliable condition over the terminals and traces and portions of the dielectric layer 168, or by applying the photoimageable material in liquid form. The solder mask layer 143 conforms to exposed surfaces of the contact pads 24 and to the upper surface 31 of the dielectric layer 168 that are exposed. The solder mask layer is selectively exposed to light, so as to selectively cure or degrade only portions of the layer. Subsequently, the portions of the solder mask layer 143 that lie on connection portions 27 of the traces 24 are removed.

As illustrated in FIGS. 1*h* and 1*i*, a chip carrier structure 16 together with the metallic walls 20 is obtained. An outline 21 of the placement of the microelectronic device is shown on the chip carrier 16. The outline may not be physically present in the real chip carrier 16, but is still shown in FIG. 1*i* for illustrative purposes.

In a next step, a microelectronic device 28 (FIG. 2) is mounted into the recess 26 defined by each chip carrier 16 and the associated metallic wall 20, thereby forming a microelectronic package 10. The microelectronic device can be mounted by reflow soldering or any other method of electrically connecting the contacts 32 of the device to the connection portion 27 of the traces 24. Before soldering the microelectronic device 28 to the chip carrier 16, device 28 has to be aligned, for example, by the use of a machine vision system for checking the position of the device 28 and comparing the position of the device with the connection portions 27 or the location of the metallic walls 20, and by use of a robotic arm to precisely position the device 28 inside the package 10. The device 28 has to be aligned so that the device pads 32 match the corresponding connection portions 27 of the contact pads 24. Alternatively, a stud-bumped electronic device may be bonded to the connection portions 27 of contact pads 24. In other variants, electronic device may be disposed in recess 26 with its contacts facing upwardly away from the dielectric layer, and these contacts may be wire-bonded to the connection portions 27 of contact pads 24.

In the manufacturing step of placing the device 28 into the chip carrier 16, an adhesive (not shown) optionally can be put onto the upper surface of the chip carrier 16 and the contact pads 24, to improve adhesion of the microelectronic device 28 to the chip carrier 16. The space 42 between the device 28 and the chip carrier would thereby be substantially filled out with the adhesive. The adhesive material may be a material which remains compliant after curing. For example, a silicone gel or compliant epoxy could be used. In other embodiments, space 42 may be unfilled. The solder or other connections may support the device 28 spaced above chip carrier 16.

After the step of attaching the microelectronic device 28 to the chip carrier 16, a step of attaching a metal lid or cover 34 to the metallic wall 20 is performed. The lid 34 forms a hermetic or near-hermetic enclosure of the semiconductor chip package. The hermetic or near-hermetic seal can be achieved by soldering the metal lid 34 onto the metallic wall 20. Other methods of attaching the lid 34 to the metallic wall 20 can be used. For example, the lid 34 could be sealed by using a laser welder. To allow a hermetic seal between the lid 34 and the upper surfaces of the metallic wall 20, the corresponding connecting surfaces of lid 34 and wall 20 should be matching, or be substantially flat. Any non-matching portions of the two surfaces forming this interconnection can be filled, for example, by solder or another sealing material.

The lower surfaces of the terminals 22 are exposed through holes 122 in the dielectric layer. Terminals 22 can be equipped with solder balls 38 (FIG. 1), solder paste, or other electrically conductive bonding-material. The bonding material serves to connect the package 10 to an external substrate, such as a printed circuit panel (not shown) or other element that supports the package 10 and provides electrically connects terminals 22 and a larger circuit. The method steps used to apply solder balls 38 onto the terminals 22 can be essentially the same as used in surface mounting of a microelectronic device to a circuit panel.

All of the steps discussed above for forming the chip carrier may be performed while the various layers are in the form of a large sheet or tape, so as to form a large sheet or tape incorporating numerous chip carriers. Likewise, the steps used to mount the microelectronic device to each chip carrier, attach the lid and attach the solder balls may be performed while the chip carriers remain in the form of a sheet or tape. The sheet or tape may be severed to yield individual packages. Alternatively, the sheet or tape may be severed at any time during the process, and subsequent process steps may be performed on individual units.

The finished semiconductor package 10 made by the process discussed above includes a microelectronic device 28 mounted to a chip carrier 16 incorporating a dielectric layer 18 and terminals 22. Dielectric layer 18 is made of a flexible material with very low moisture and gas permeability. The microelectronic device 28 can be a semiconductor chip or die, or a piezoelectric element such as a filter element for surface acoustic wave (SAW), other types of radio frequency (RF) filters, sensitive sensor elements such as an image sensor, micromechanical systems, micro-electro-mechanical systems (MEMS) or any other microelectronic device.

In the embodiment shown in FIG. 2, the terminals 22 are offset from the contacts 32 of the microelectronic device 28 in a horizontal direction, and are electrically connected together by means of traces 24. Depending on the application, there may be no offset at all, or can also be up to 2 mm. The offset together with the flexibility of the traces 24 formed by thin layers of metal, and the flexibility of the dielectric layer 18 allow some independent vertical displacement of each terminals 22 relative to the chip. The space 42 between the microelectronic device 28 and the terminals 22 facilitates flexing of the chip carrier 16.

This flexibility of the above described structure allows independent movement of the terminals 22, for example, to facilitate engagement of the solder balls 38 with contact pads on a circuit board (not shown) despite irregularities in the circuit board or the package, such as warpage of the circuit board. Movability of the terminals also presents advantages in connection reliability, if the package is subjected to thermal cycles and the consequent thermal expansion of the package, the circuit board and the chip. Additionally, this movability of the terminals also facilitates simultaneous engagement of the plural terminals with a test fixture, and thus simplifies testing of the package. In the embodiment discussed above, the terminals 22 are disposed on the top surface 31 of dielectric layer 18, and are exposed at the bottom surface 33 of the dielectric through holes 122 in the dielectric layer. The terminals have horizontal dimensions larger than the holes, so that the terminals effectively seal the holes. To provide effective sealing, the diameter of each terminal 22 desirably is about 300 µm larger than the diameter of the associated hole, at least about 100 µm.

The packaged microelectronic device 28 fits into the recess 26 formed by the inner sides of the metallic wall 20 and the upper surface 31 of the chip carrier 16. The free space between the metallic walls 20 and the microelectronic device 28 preferably is minimal so as to reduce overall package size, but sufficient to permit placement and mechanical alignment of the microelectronic device onto the connection portions. In a variant, the inner dimensions of the metallic walls 20 are made so as to fit closely with the device 28. In this variant, the device 28 is aligned with the connection portion 27 by engaging the edges of the device with the walls 20. Thus, no further mechanical alignment is necessary.

Package 10 as a whole desirably has a helium leak rate of around $10^{-5}$ atm cm$^3$/sec or less, and therefore, is near-hermetically sealed under the standard MIL-STD-882.

Package 10 desirably is thin, and thereby has a very low packaging height on a circuit board. The thickness of the package, from the bottom surface 33 of the dielectric layer 18 to the top of lid 34 (without any protruding elements of the connections 22 or any solder balls 38 attached thereto) can be between 100 µm to 300 µm, more preferably between 130 µm to 300 µm. It is possible that the thickness of the package may exceed the thickness of the microelectronic device itself by 200 µm or less, more preferably 100 µm or less.

Figure 3A:
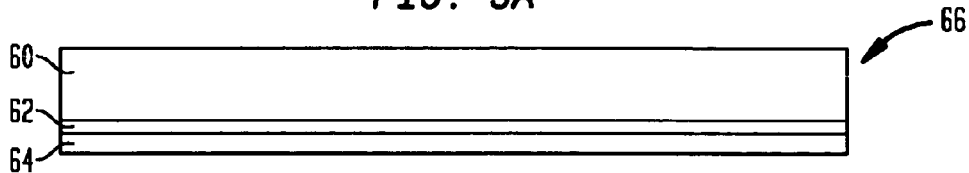
FIGS. 3a-3f are diagrammatic sectional views of a package according to another embodiment during various stages of a manufacturing process according to a further embodiment.
Figure 3B:
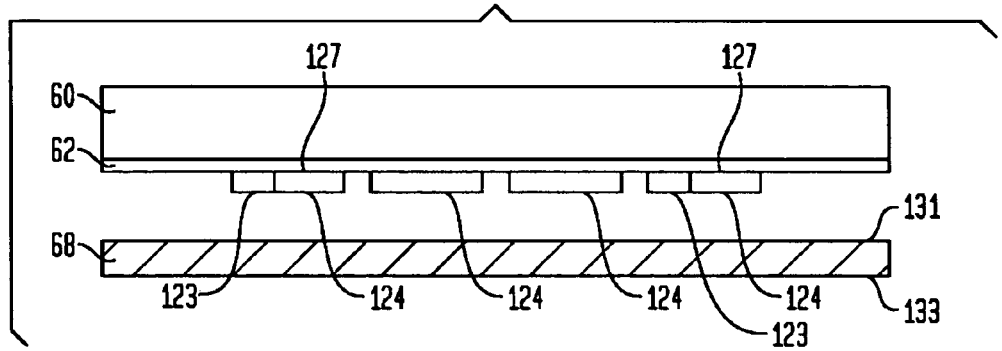

A manufacturing method according to a further embodiment (FIGS. 3a-3g) is generally similar to the method discussed above with reference to FIGS. 1a-1i. However, the subassembly or composite metal plate 66 used in this method includes a bottom layer 64 made of a conductive material, an intermediate etch-resistant layer 62 and a top layer 60 made of a conductive material is provided. The top and bottom layers 60, 64 may include electrically conductive materials such as copper as discussed above for forming the walls and the conductive features of the chip carrier. The intermediate etch-resistant layer 62 may include materials such as nickel resistant to etching by an etchant which attaches layers 60 and 64. Referring to FIG. 3b, the bottom layer 64 of metallic plate 66 is etched to remove portions 25 of the bottom layer 64 so as to leave only the desired conductive features of the chip carrier, such as traces 124 and terminals 123, the traces having connection portions 127 at their ends remote from terminals 123.

Figure 3C:
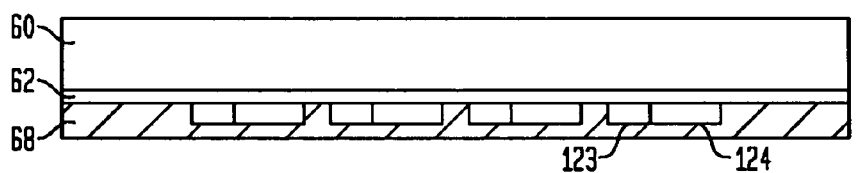

Referring to FIGS. 3b and 3c, a flexible dielectric layer 68, such as an LCP film is assembled with the etch-resistant layer 62 or formed in place on the etch-resistant layer 62, so that the conductive features 123, 124 are embedded with the LCP material. An upper surface 31 of the dielectric layer 68 faces toward the etch-resistant layer 62 and a lower surface 33 of the dielectric layer 68 faces away from the etch-resistant layer 62. The dielectric layer 68 may be fabricated by coating a dielectric layer such as LCP onto the etch-resistant layer 62 and around and on the conductive features 123, 124.

Figure 3D:
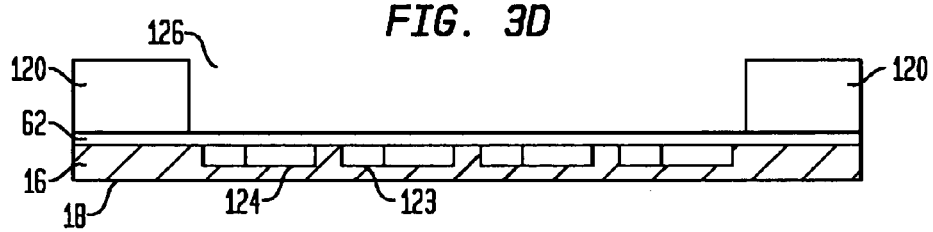

Referring to FIG. 3d, once the dielectric layer 68 is in place, a portion of the top metal layer 60 is etched to form the metallic walls 120 forming a recess 126.

Figure 3E:
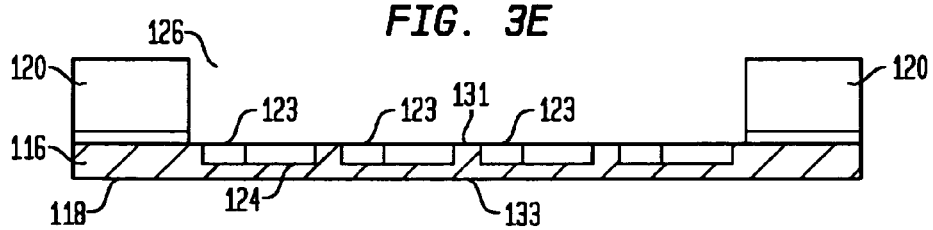
Figure 3F:
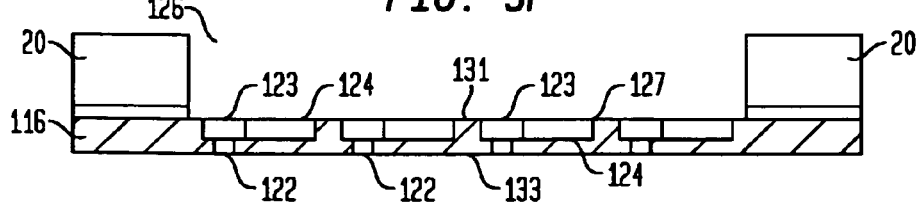

Referring to FIG. 3e, the etch-resistant layer 62 that remains inside the recess 26 is removed, leaving conductive features including traces 124 and terminals 123 having their upper surfaces flush with upper surface 31 of the dielectric layer 18. The conductive features are therefore substantially embedded into the dielectric layer. Optionally, a solder mask layer (not shown) can be placed on top of the upper surface 31 of the dielectric layer 18 and on top of the conductive features, and patterned to omit the solder mask layer from the connection portions 127 of the traces 24, if desired. In FIG. 3g, the dielectric layer 18 is further processed to form openings 122 in alignment with at least some of the terminals 123, and thus leave terminals 123 exposed at the bottom surface 133 of the dielectric layer.

The resulting chip carrier 116 may then be assembled with a microelectronic device 28 as discussed above.

Figure 4:
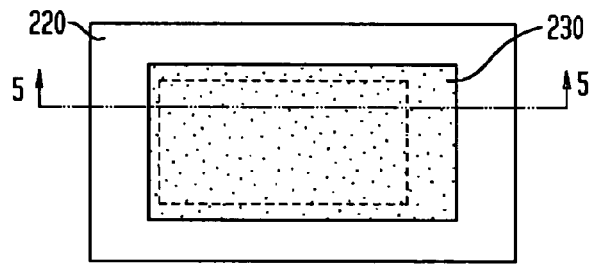
FIG. 4 is a diagrammatic top view depicting components in a method in accordance with a further embodiment.
Figure 5:
FIG. 5 is a diagrammatic sectional view along line 5-5 in FIG. 4.

In another embodiment of the microelectronic package, as shown in FIGS. 4 and 5, after forming the recess 226 and metallic wall 220, and after the connection of a device 228 to the traces and terminals, the remaining portion of the recess 226 can be filled with a mold compound or a potting material 230. The metallic wall 220 thereby has a first function of forming sidewalls for the semiconductor package, and also has a second function of working as a dam for the potting material 230, while the potting material 230 is in its liquid state. During such a step of manufacturing the semiconductor package, the mold compound or potting material can be poured into the recess 226, while the chip carrier is held horizontally. The chip carrier 216 preferably is held in a horizontal position until the potting material 230 is hardened. It is possible to perform such a step in a heated chamber, to reduce the viscosity of the potting material and to decrease hardening time.

The potting material 230 filled into the recess will level out over the entire recess 226. The potting material 230, once hardened, can provide an additional mechanical attachment of the device 228 to the dielectric element of the package. The potting material can also provide improved thermal conductivity between the device 228 and elements of the package including the side walls 220 and the chip carrier 216. The potting material may be a material with high thermal conductivity, such as an electrically insulating urethane, epoxy, silicon or other resin composition with a thermally-conductive filler. The recess 26 can be entirely filled with the mold compound or potting material, and the potting material can cover the surface of the microelectronic device, as shown in FIG. 5.

In a variant of this approach, the lower portion of the recess 226, including the space 242 between the device 228 and the chip carrier 216 may be filled with an adhesive or non-adhesive material, such as a relatively soft filler or first potting material, whereas the remaining space in the recess can be filled with a second potting material having higher thermal conductivity. The second potting material may be stiffer than the first potting material.

The step of filling of the recess 226 with the potting material can be performed under vacuum or in an inert atmosphere to eliminate inclusion of oxygen and other gases in the semiconductor package. In a further variant, the lid 234 may be applied and sealed while the vacuum or inert atmosphere is maintained. In yet another variant, the lid 234 may contact the upper surface of device 228, the potting material 226, or both. This arrangement provides even greater thermal conductivity. In yet another variant, the step of applying and sealing the lid under inert gas or under vacuum can be performed without using an encapsulant or potting compound, so that the space 230 is filled with an inert gas or is under vacuum after sealing the lid.

Figure 8:
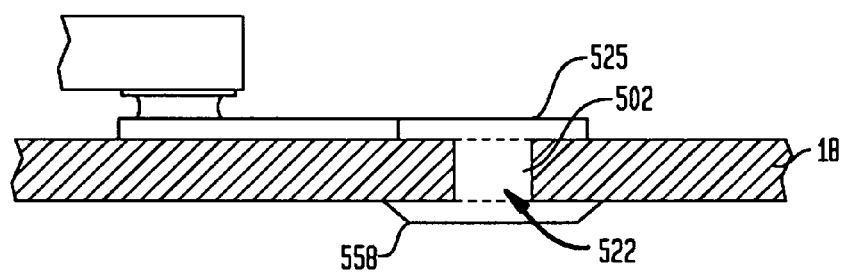
FIGS. 8 and 9 are fragmentary diagrammatic sectional views depicting portions of packages according to still further embodiments.

In a package according to another embodiment, the metallic walls 320 have a height equal to, or less than, the height of the upper surface of the microelectronic device 328, as illustrated in the embodiment of FIG. 8. The height of the metallic wall 320 and the height of conductive features 324 may be substantially equal. For example, the metallic wall 320 and the conductive features 324 may be formed from the same metal layer by etching this metal layer to form both the wall and the conductive features. In this variant, the lid 334 enclosing the semiconductor package would not be flat, but would have a bent shape or a U-shape from a cross-sectional view, so that the recess 326 enclosing the microelectronic device would be substantially formed by the lid 334, and not by the chip carrier 316 and the walls 320. In a further variant, the height of the metallic walls 320 and the dimensions of the lid 334 are chosen so that the lid 334 to touches the microelectronic device 328 when the lid is in place on walls 320, thereby improving thermal conductivity between the upper surface of the device and the lid.

In yet another variant, an element with high thermal conductivity such as a thermally conductive paste or grease, or a metallic element is positioned on the upper surface of the microelectronic device before closing the package with the lid. The thermally conductive element desirably covers a large portion of the device upper surface. In yet another variant, the microelectronic device may be soldered to the lid.

Figure 6:
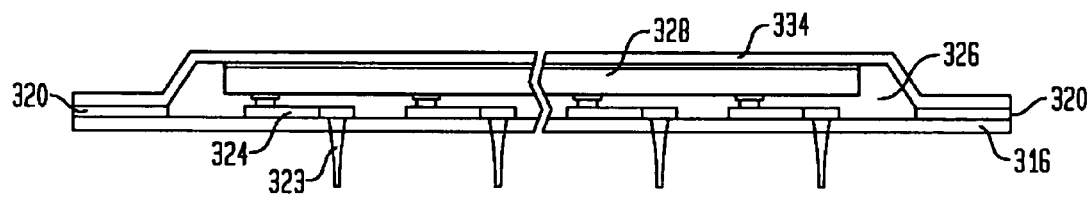
FIG. 6 is a diagrammatic sectional view of a package according to another embodiment.

In the embodiment of FIG. 6, the terminals 323 are in the form of pillars or posts which protrude downwardly out of the dielectric layer 316. The posts are made of electrically conductive material. When the package is mounted to a circuit panel, the bottom tips of posts 323 may be soldered to connection portions of the wiring board. Posts 323 may be formed integrally with the conductive elements 323 as, for example, by using a multi-layer metallic structure and etching one of the layers to form the posts. Terminals of this type can be used in the other embodiments discussed herein.

Figure 7:
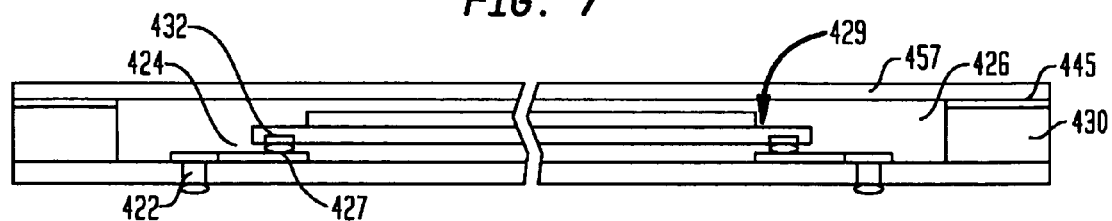
FIG. 7 is a diagrammatic sectional view of a package according to yet another embodiment.

In the embodiment shown in FIG. 7, the metallic lid discussed above is replaced by a lid 457 which is formed from glass or other material transparent to light. This arrangement can be used, for example, for the packaging of any microelectronic device that requires light, such as photodiode sensor elements, CCD and CMOS image sensors, etc., or for any microelectronic device which emits light, such as small display devices. In this embodiment as well, the enclosure provided by the lid and walls keeps moisture and other contaminants out of the package, and thus maintains the characteristics of the image sensor during use. This arrangement can be used, for example, in a digital camera or in a camera-equipped cellular telephone. For example, an image sensor 429 can be flip-chip or wire-bond packaged into the recess 426. The glass lid 457 is sealed to the top edges of walls 430 using a sealing material 445 that provides a hermetic or near-hermetic connection interface between the glass lid 457 and the upper surface of the walls 430.

Figure 9:
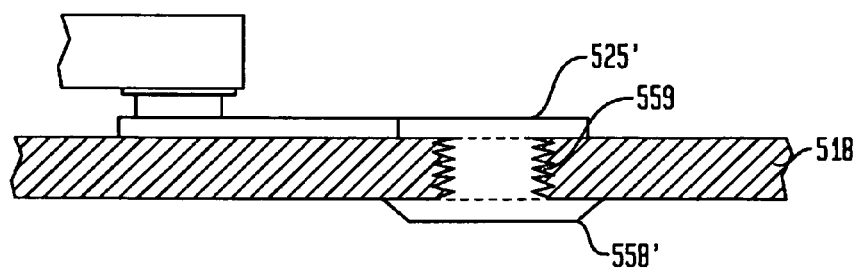

In the embodiment of FIG. 7, the conductive elements 424 extend outwardly from the location of the device pads 432, and connection portions 427, to terminals 422, so that the terminals 422 are disposed outside of the area covered by the microelectronic device. Such arrangement of the conductive elements is referred to as a "fan-out" design. In this arrangement, and in the arrangements discussed above, the pitch of the terminals can be bigger than the pitch of the device pads of the microelectronic device. In the opposite arrangement, referred to as a fan-in design, the conductive elements extend inwardly to the terminals, so that the terminals are disposed within the outline of the microelectronic device. Such an arrangement reduces the horizontal dimensions of the package 10. In other embodiments, the terminals may be aligned with the pads of the microelectronic device without a horizontal offset In the variant depicted in FIG. 8, the terminal 522 includes a pad 525 on the top or inside surface of the dielectric layer 518 and a pad 558 on the outside or bottom surface of the dielectric layer, as well as a shaft portion extending between these pads and extending through a hole 502 in the dielectric layer. Both of these pads have horizontal dimensions greater than the dimensions of hole 502. For example, pads 525, 558 may be about 50 μm-150 μm larger in diameter than hole 502. The pads increase the length of a potential leakage or diffusion path for moisture and gases through the dielectric layer. The pads 558 on the bottom surface can be soldered or otherwise bonded to a substrate or external wiring board. In yet another variant, the pads 558 on the bottom surface of the dielectric layer can be replaced by pins or posts which have larger diameter than the holes 502. In a further variant (FIG. 9), the side walls 559 of the holes in the dielectric layer are convoluted, and the shaft portions of the terminals are also convoluted. The convoluted surface 559 increases the leakage path, and thereby improves the hermeticity of the package.

In yet another variant, the surface of the dielectric layer can be convoluted at the location where the wall, such as wall 20 (FIG. 2) joins the dielectric layer. Here again, the convolutions will provide longer leakage paths.

Figure 10:
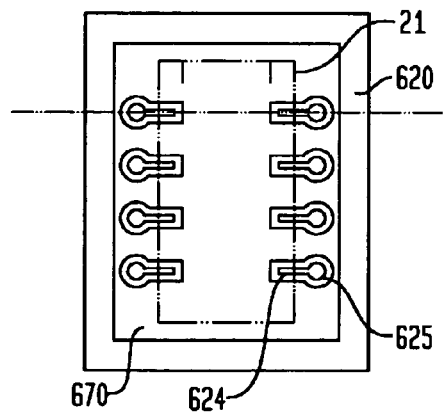
FIG. 10 is a diagrammatic top view showing a portion of a package according to yet another embodiment.

As shown in FIG. 10, a metallic shielding layer 670 is provided on the upper surface of the dielectric layer 618. Shielding layer 670 is electrically isolated from all or most of the conductive elements 624, as by gaps 625 surrounding the conductive elements. The shielding layer provides electromagnetic shielding, such as radio frequency (RF) shielding. Additionally, the shielding layer reduces gas permeation into the package. Such a shielding layer can be formed from the same conductive layer used to make the conductive elements. Merely by way of example, the gaps 625 between shielding layer 670 and the conductive elements 624 can be in the range of 5 µm to 100 µm wise. The shielding layer can also electrically contact those conductive elements 624 which serve as the ground or power terminals and contact pads for the microelectronic device. The shielding layer 670 may contact the side walls 620 of the package. The shielding layer may be covered by a solder mask layer as discussed above to avoid solder bridging when a device is soldered to the conductive elements 624.

To provide still further electromagnetic shielding, permeation resistance, or both, the chip carrier may include a substantially continuous metallic plane, such as a ground plane, extending on a lower surface of the chip carrier facing away from the microelectronic device. Further metallic layers or particles or particles may be provided inside the dielectric layer of the chip carrier. For example, the dielectric layer may be made in a form of a multilayer structure with conductive layers embedded therein.

In the embodiments discussed above, the dielectric layer is the same size as the outer dimensions of the wall. However, the dielectric layer may project outwardly beyond the wall, so that additional components can be mounted on the outwardly-projecting portions of the dielectric layer. These components may be elements which do not require the protection afforded by the wall and lid. Also, although the walls depicted in the drawing enclose rectangular regions, the walls may have any shape.

Although the aspects herein have been described with reference to particular embodiments, it is to be understood that these embodiments are merely illustrative of the principles and applications of the various embodiments. It is therefore to be understood that numerous modifications may be made to the illustrative embodiments and that other arrangements may be devised without departing from the spirit and scope of the present invention as defined by the appended claims.

The invention claimed is:

1. A microelectronic package comprising:
   (a) a polymeric dielectric layer having top and bottom surfaces, the dielectric layer having terminals exposed at the bottom surface;
   (b) a metallic wall bonded to the dielectric layer and projecting upwardly from the top surface of the dielectric layer and surrounding a region of the top surface;
   (c) a lid bonded to the wall and extending over the region of the top surface so that the lid, the wall and the dielectric layer cooperatively define an enclosed space; and
   (d) a microelectronic element disposed within the space and electrically connected to the terminals, the microelectronic element having a front surface, a rear surface, and opposed edges extending between the front surface and the rear surface,
   wherein the metallic wall surrounds the microelectronic element and a region of the top surface of the dielectric layer, and
   wherein the top surface of the metallic wall extends beyond the opposed edges of the microelectronic element, and the bottom surface of the metallic wall extends beyond the opposed edges of the microelectronic element.

2. The package as claimed in claim 1 wherein the lid is metallic.

3. The package as claimed in claim 1 wherein the lid is metallurgically bonded to the wall.

4. The package as claimed in claim 1 wherein the dielectric layer includes a liquid crystal polymer.

5. The package as claimed in claim 4 wherein the dielectric layer is about 15-100 µm thick.

6. The package as claimed in claim 1 wherein the dielectric layer has holes extending through it and the terminals cover the holes.

7. The package as claimed in claim 6 wherein the terminals have dimensions larger than the holes.

8. The package as claimed in claim 6 wherein the terminals are disposed remote from the bottom surface of the dielectric layer and are exposed at the bottom surface through the holes.

9. The package as claimed in claim 1 further comprising metallic traces on the dielectric layer, the microelectronic element being electrically connected to the terminals through at least some of the traces.

10. The package as claimed in claim 9 wherein the wall, the terminals, and the traces are formed at least in part from portions of a common metallic layer.

11. A package substrate comprising:
    (a) a polymeric dielectric layer having top and bottom surfaces, the dielectric layer having terminals exposed at the bottom surface; and
    (b) a metallic wall having a top surface and a bottom surface, the metallic wall being bonded to the dielectric layer and projecting upwardly from the top surface of the dielectric layer and surrounding a region of the top surface of the dielectric layer thereby defining a partially enclosed space, configured to accommodate a microelectronic element having a front surface and a rear surface,
    wherein the top surface of the metallic wall extends beyond the front surface of the microelectronic element, and the bottom surface of the metallic wall extends beyond the rear surface of the microelectronic element.

12. The microelectronic package of claim 1 wherein the dielectric layer is flexible.

13. The microelectronic package of claim 1 wherein said metallic wall and said lid are integrally formed.

14. A microelectronic package comprising:
    (a) a dielectric layer having top and bottom surfaces, the dielectric layer having terminals exposed at the bottom surface;
    (b) a continuous metallic wall bonded to the dielectric layer, the metallic wall having a top surface and a bottom surface and projecting upwardly from the top surface of the dielectric layer;
    (c) a lid bonded to the wall and extending over the region of the top surface so that the lid, the wall and the dielectric layer cooperatively define an enclosed space; and (d) a microelectronic element having a front surface and a rear surface, the microelectronic element disposed within the space and electrically connected to the terminals, wherein the metallic wall surrounds the microelectronic element and a region of the top surface of the dielectric layer, and wherein the top surface of the metallic wall extends beyond the front surface of the microelectronic element, and the bottom surface of the metallic wall extends beyond the rear surface of the microelectronic element.

15. The microelectronic package of claim 14, wherein the metallic wall further comprises an edge extending between the top surface and the bottom surface, wherein the microelectronic element further comprises an edge extending between the front and rear surfaces, and wherein the edge of the metallic wall and the edge of the microelectronic element extend in a vertical direction transverse to a direction the terminals extend across the bottom surface of the dielectric layer.

\* \* \* \* \*